US012751041B2

(12) United States Patent
Du

(10) Patent No.: US 12,751,041 B2
(45) Date of Patent: Sep. 29, 2026

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventor: Hye Won Du, Chungcheongbuk-do (KR)

(73) Assignee: DB HiTek Co., Ltd., Bucheon-si (KR)

( * ) Notice: Subject to any disclaimer, the term of this patent is extended or adjusted under 35 U.S.C. 154(b) by 385 days.

(21) Appl. No.: 18/431,550

(22) Filed: Feb. 2, 2024

(65) Prior Publication Data

US 2025/0203919 A1 Jun. 19, 2025

(30) Foreign Application Priority Data

Dec. 19, 2023 (KR) ........................ 10-2023-0185577

(51) Int. Cl.

*H10D 30/65* (2025.01)
*H10D 30/01* (2025.01)
*H10D 62/17* (2025.01)
*H10P 30/20* (2026.01)
*H10P 30/22* (2026.01)

(52) U.S. Cl.

CPC ......... *H10D 30/65* (2025.01); *H10D 30/0281* (2025.01); *H10D 62/314* (2025.01); *H10P 30/204* (2026.01); *H10P 30/212* (2026.01); *H10P 30/22* (2026.01)

(58) Field of Classification Search

CPC .... H10D 30/65; H10D 62/106; H10D 30/603; H10D 30/0281; H10D 30/0221

See application file for complete search history.

(56) References Cited

U.S. PATENT DOCUMENTS

2002/0132405 A1* 9/2002 Disney ............... H10D 30/0281 257/E29.136
2004/0222461 A1* 11/2004 Peyre-Lavigne .. H10D 30/0281 257/E29.256
2007/0138551 A1* 6/2007 Ko ..................... H10D 30/0221 257/493
2009/0321822 A1* 12/2009 Knaipp .................. H10D 30/65 257/E29.261
2013/0341715 A1* 12/2013 McGregor ......... H10D 30/0221 257/E29.256
2020/0043801 A1* 2/2020 Kim ................... H10D 30/0221
2022/0367711 A1* 11/2022 Lee .................... H10D 30/0221

FOREIGN PATENT DOCUMENTS

KR 10-2012-0055139 A 5/2012

* cited by examiner

*Primary Examiner* — Evren Seven

(74) *Attorney, Agent, or Firm* — Bridgeway IP Law Group, PLLC; Jihun Kim

(57) ABSTRACT

A high-voltage semiconductor device which has a substrate, a gate field plate, a gate region, and a drift region and a method of manufacturing the high-voltage semiconductor device are described. The drift region has a first impurity region and a second impurity region covering at least one side wall of the first impurity region. The high-voltage semiconductor device is capable of alleviating electric field concentration at an edge of a gate field plate and of preventing deterioration of characteristics of specific on-resistance (Rsp) by having a second impurity region in the drift region covering the first impurity region.

9 Claims, 14 Drawing Sheets

HIGH VOLTAGE SEMICONDUCTOR DEVICE AND METHOD OF MANUFACTURING SAME

CROSS REFERENCE TO RELATED APPLICATION

The present application claims priority to Korean Patent Application No. 10-2023-0185577, filed Dec. 19, 2023, the entire contents of which is incorporated herein for all purposes by this reference.

BACKGROUND OF THE INVENTION

Field of the Invention

The present disclosure relates to a high-voltage semiconductor device and a method of manufacturing the same. More particularly, the present disclosure relates to a high-voltage semiconductor device and a method of manufacturing the same, and the high-voltage semiconductor device is capable of alleviating electric field concentration at an edge of a gate field plate and of preventing deterioration of characteristics of specific on-resistance (Rsp) while a second impurity region in a drift region is formed to cover a first impurity region.

Description of the Related Art

LDMOS (Lateral Double diffused Metal Oxide Semiconductor) is a representative power device with fast switching response and high input impedance. Hereinbelow, a structure and a manufacturing process of a general LDMOS device will be described in detail.

FIG. 1 is a sectional view showing a formation process of a drift region in a conventional high-voltage semiconductor device.

Referring to FIG. 1, the conventional high-voltage semiconductor device may include a drift region 920 formed in a substrate 910, and a gate field plate 930 formed at the part of a surface of the substrate 910 where the drift region 920 is overlapped.

Furthermore, the drift region 920 may be formed by an impurity ion implantation process. In other words, the drift region 920 may be formed by, after forming a photoresist pattern PR on the substrate 910, performing the second conductivity type impurity ion implantation process into the substrate 910. At this point, group 15 elements may be used as the second conductivity type impurity ion. To form the drift region 920, after a first layer 921 is formed at the part of the surface of the substrate 910 by the impurity ion implantation process by using the photoresist pattern PR, a second layer 923 may be formed below the first layer 921 by the impurity ion implantation process. At this point, since the first layer 921 and the second layer 923 are formed by using the same photoresist pattern PR, end portions 921*a* and 923*a* directly below a side wall of the photoresist pattern PR may be formed to be physically distinguishable from each other. In other words, the second layer 923 is not formed in a structure covering the first layer 921, but respective layers 921 and 923 may be formed to be substantially distinguishable from each other.

In this structure of the drift region 920, a problem of concentrating electric fields at the part of an edge of the gate field plate 930 arises. Therefore, the part of the edge of the gate field plate 930 has a structure weak at hot carrier injection effect (HCI), thereby causing a problem of deteriorating the characteristics of breakdown voltage and on-resistance of the device.

In order to solve the above-described problems, the inventor of the present disclosure would like to present a new high-voltage semiconductor device with an improved structure and a method of manufacturing the same, and details of which will be described below.

DOCUMENTS OF RELATED ART (Patent Document 0001) Korean Patent Application Publication No. 10-2012-0055139 "LDMOS SEMICONDUCTOR DEVICE"

SUMMARY OF THE INVENTION

The present disclosure has been made keeping in mind the above problems occurring in the related art, and the present disclosure is intended to provide a high-voltage semiconductor device and a method of manufacturing the same, which are capable of alleviating electric field concentration at the part of an edge of a gate field plate and of preventing deterioration of characteristics of specific on-resistance (Rsp), while a second impurity region in a drift region is formed to cover a first impurity region.

Another objective of the present disclosure is to provide a high-voltage semiconductor device and a method of manufacturing the same, which are capable of preventing deterioration of characteristics of specific on-resistance of the device, while a doped concentration of the drift region which is reduced due to a protruding region of a first impurity region is compensated with a second impurity region.

Yet another objective of the present disclosure relates to a high-voltage semiconductor device and a method of manufacturing the same, which are capable of improving characteristics of breakdown voltage by forming a drain extension region covering a drain region.

The present disclosure may be realized by embodiments having the following configuration to achieve the above-described objectives.

According to an embodiment of the present disclosure, a high-voltage semiconductor device according to the present disclosure includes: a substrate; a gate field plate disposed at a substrate surface of the substrate; a gate region disposed on the substrate, wherein the gate region is partly disposed on the gate field plate; and a drift region disposed in the substrate, wherein the drift region may include: a first impurity region disposed at the substrate surface; and a second impurity region covering at least one side wall of the first impurity region.

According to another embodiment of the present disclosure, the high-voltage semiconductor device according to the present disclosure is characterized in that the drift region may have group 15 element impurity ion.

According to another embodiment of the present disclosure, the high-voltage semiconductor device according to the present disclosure is characterized in that the second impurity region may have group 15 element impurity ion having atomic weight smaller than atomic weight of the group 15 element impurity ion of the first impurity region.

According to another embodiment of the present disclosure, the high-voltage semiconductor device according to the present disclosure is characterized in that the second impurity region may cover a lower portion of the first impurity region and the at least one side wall of the first impurity region.

According to another embodiment of the present disclosure, the high-voltage semiconductor device according to the present disclosure is characterized in that the first impurity region may be formed by using a hard mask that is used for forming the gate field plate.

According to another embodiment of the present disclosure, the high-voltage semiconductor device according to the present disclosure is characterized to include a body region disposed in the substrate; a source region disposed at the substrate surface, in the body region; and a drain region disposed apart from the source region, the drain region being disposed at the substrate surface and in the substrate.

According to another embodiment of the present disclosure, the high-voltage semiconductor device according to the present disclosure is characterized to include a drain extension region covering the drain region, the drain extension region being disposed in the substrate, wherein the drain extension region may have an impurity low concentration doped region in comparison to the drain region.

According to another embodiment of the present disclosure, the high-voltage semiconductor device according to the present disclosure is characterized to include: a substrate; a gate field plate disposed at a substrate surface of the substrate; a gate region disposed on the substrate, wherein the gate region is partly disposed on the gate field plate; a drift region of a second conductivity type disposed in the substrate; a body region of a first conductivity type disposed in the substrate; a source region of the second conductivity type disposed in the body region; and a drain region of the second conductivity type disposed in the drift region, wherein the drift region may include: a first impurity region disposed at the substrate surface; and a second impurity region disposed below the first impurity region, wherein the first impurity region may include: a protruding region protruding towards the source region from a part of the first impurity region facing the source region.

According to another embodiment of the present disclosure, the high-voltage semiconductor device according to the present disclosure is characterized in that the second impurity region may cover the protruding region.

According to another embodiment of the present disclosure, the high-voltage semiconductor device according to the present disclosure is characterized in that the second impurity region may include: a first layer disposed below the first impurity region in the substrate; and a second layer disposed below the first layer in the substrate.

According to another embodiment of the present disclosure, the high-voltage semiconductor device according to the present disclosure is characterized in that the drift region may have an impurity low concentration doped region in comparison to the drain region.

According to another embodiment of the present disclosure, the high-voltage semiconductor device according to the present disclosure is characterized in that the drift region may be formed immediately before a formation process of the gate field plate.

According to an embodiment of the present disclosure, a method of manufacturing a high-voltage semiconductor device according to the present disclosure includes: forming a hard mask on a substrate and a photoresist pattern on the hard mask; forming a drift region in the substrate by using the hard mask and the photoresist pattern; forming a gate field plate at a substrate surface of the substrate by using the hard mask; forming a body region in the substrate; forming a gate region on the substrate; and forming a source region and a drain region in the substrate and at the substrate surface.

According to another embodiment of the present disclosure, the method of manufacturing the high-voltage semiconductor device according to the present disclosure is characterized in that the forming of the drift region may include: forming a first impurity region at the substrate surface, by using the hard mask and the photoresist pattern; and forming a second impurity region below the first impurity region in the substrate, by using the hard mask and the photoresist pattern.

According to another embodiment of the present disclosure, the method of manufacturing the high-voltage semiconductor device according to the present disclosure is characterized in that the forming of the second impurity region may include: forming a first layer at a predetermined depth below the first impurity region, in the substrate; and forming a second layer below the first layer, in the substrate.

According to another embodiment of the present disclosure, the method of manufacturing the high-voltage semiconductor device according to the present disclosure is characterized in that the first impurity region may include: a protruding region formed below the hard mask to be overlapped with the hard mask.

According to another embodiment of the present disclosure, the method of manufacturing the high-voltage semiconductor device according to the present disclosure is characterized in that the protruding region may have a vertical width less than the first impurity region excluding the protruding region.

According to another embodiment of the present disclosure, the method of manufacturing the high-voltage semiconductor device according to the present disclosure is characterized in that the second impurity region may cover the protruding region.

According to another embodiment of the present disclosure, the method of manufacturing the high-voltage semiconductor device according to the present disclosure is characterized to include before the forming of the drain region, forming a drain extension region in the substrate, wherein the drain region may be surrounded by the drain extension region.

The present disclosure has the following effects according to the configuration described above.

The present disclosure has the effect of alleviating electric field concentration at the part of an edge of a gate field plate and of preventing deterioration of the characteristics of specific on-resistance (Rsp), while a second impurity region in a drift region is formed to cover a first impurity region.

Furthermore, the present disclosure has the effect of preventing deterioration of the characteristics of specific on-resistance of the device, while a doped concentration of the drift region which is reduced due to a protruding region of a first impurity region is compensated with a second impurity region.

Furthermore, the present disclosure has the effect of improving the characteristics of breakdown voltage by forming a drain extension region covering a drain region.

Meanwhile, it should be added that even if the effects are not explicitly mentioned herein, the effects described in the following specification expected by the technical features of the present disclosure and their potential effects can be treated as if they were described in the specifications of the present disclosure.

DETAILED DESCRIPTION OF THE INVENTION

Hereinbelow, embodiments of the present disclosure will be described in detail with reference to accompanying drawings. The embodiments of the present disclosure may be modified in various forms, and the scope of the present disclosure should not be construed as being limited to the following embodiments, but should be construed based on the matters described in the claims. In addition, these embodiments are only provided for reference in order to more completely explain the present disclosure to those of ordinary skill in the art.

Hereinafter, it should be noted that when one component (or layer) is described as being disposed on another component (or layer), one component may be disposed directly on another component, or another component(s) or layer(s) may be located between the components. In addition, when one component is expressed as being directly disposed on or above another component, no other component(s) are located between the components. Moreover, being located on “top”, “upper”, “lower”, “top”, “bottom” or “one (first) side” or “side” of a component means a relative positional relationship.

In addition, although the terms first, second, etc. may be used to describe various items such as various elements, regions, and/or parts, the items should not be limited by these terms.

Furthermore, it should be noted that in cases where a specific embodiment can be implemented differently, a specific process sequence may be performed differently from the sequence described below. For example, the two processes described sequentially may be performed substantially simultaneously or may be performed in the opposite sequence.

The terms used below, MOS (Metal-Oxide Semiconductor), is a general term, and “M” is not limited to just metals and may be made of various types of conductors. Furthermore, “S” may be a substrate or a semiconductor structure, and “O” is not limited to oxides and may include various types of organic matters or inorganic matters.

Additionally, the conductivity type or the doped region of each component may be defined as “P type” or “N type” depending on the main carrier characteristics, but this is only for convenience of explanation, and the technical spirit of the present disclosure is not limited to what is illustrated. For example, hereinbelow, more general terms “first conductivity type” or “second conductivity type” are used as “P type” or “N type”. At this point, the first conductivity type means the P type, and the second conductivity type means the N type, and if necessary, the first conductivity type may be the N type and the second conductivity type may be the P type.

Furthermore, it should be understood that “high concentration” and “low concentration”, which express doped concentration of an impurity region, mean relative doped concentration between a first component and a second component.

For example, the high-voltage semiconductor device below may be an nLDMOS device and there is not limitation thereto.

Figure 2:
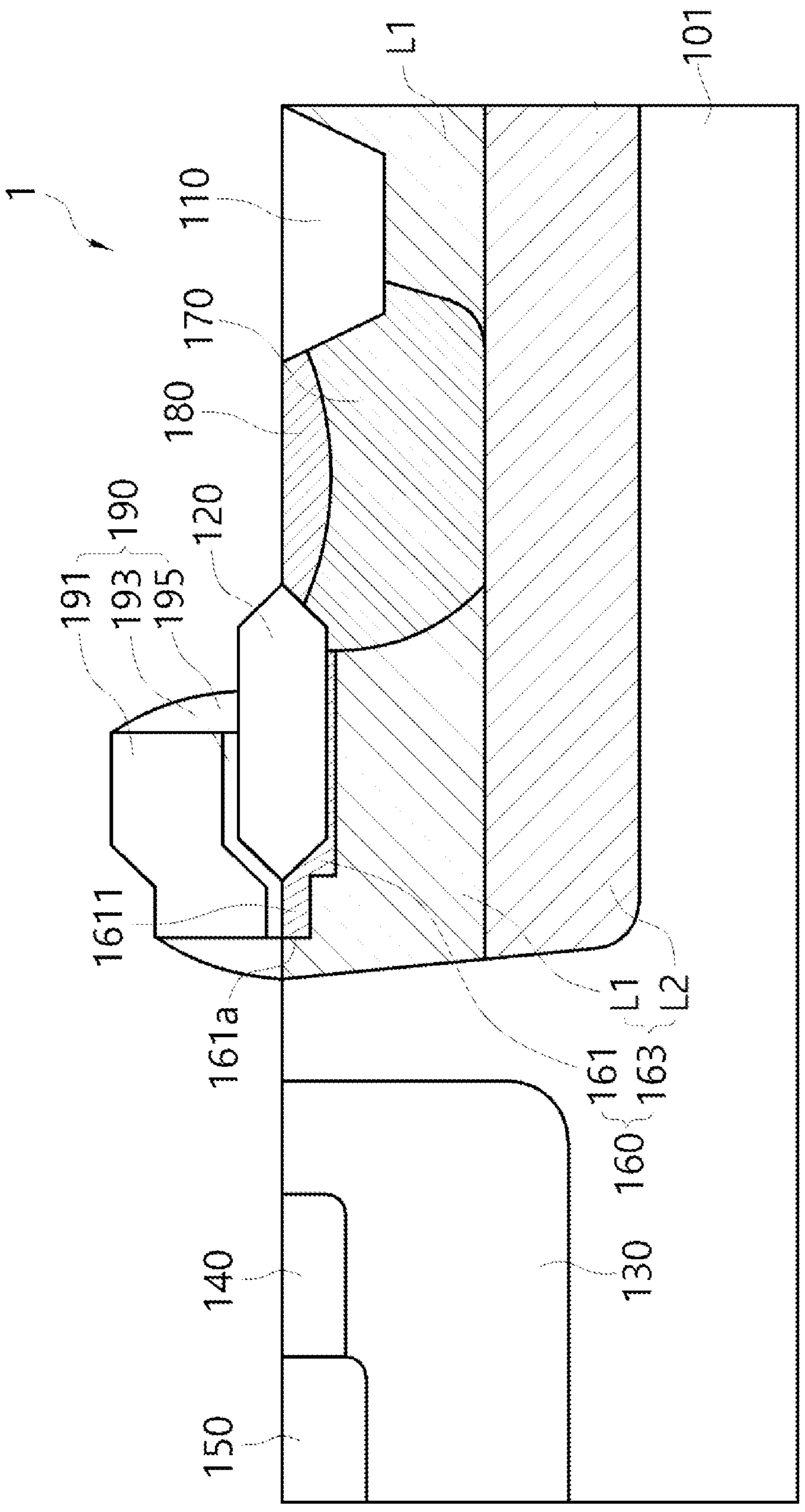
FIG. 2 is a sectional view showing a high-voltage semiconductor device according to an embodiment of the present disclosure.

FIG. 2 is a sectional view showing a high-voltage semiconductor device according to an embodiment of the present disclosure.

Hereinbelow, a high-voltage semiconductor device according to an embodiment of the present disclosure will be described in detail with reference to accompanying drawings.

Referring to FIG. 2, the present disclosure relates to a high-voltage semiconductor device 1 and, more particularly, to a high-voltage semiconductor device 1 having a second impurity region covering a first impurity region in a drift region, thereby reducing electric field concentration at the part of an edge of a gate field plate and preventing deterioration of characteristics of specific on-resistance (Rsp).

First, according to the embodiment of the present disclosure, a substrate 101 is formed in the high-voltage semiconductor device 1. The substrate 101 may be a substrate doped with a first conductivity type, and may include a P-type diffusion region in a substrate, or may include a P-type epitaxial layer that is epitaxially grown, on a substrate. Furthermore, a well region that is used as an active region may be formed at the substrate 101, and the active region may be prescribed by a device division film 110. The device division film 110 may be formed to a predetermined depth from a surface of the substrate 101 by a STI (shallow trench isolation) process, and there is no limitation thereto.

Furthermore, the high-voltage semiconductor device 1 may include a gate field plate 120 formed at the part overlapped with a gate region 190 to be described below. In other words, a portion of a lower part of the gate region 190 may be formed on the gate field plate 120. The gate field plate 120 may be formed at the part of the surface of the substrate 101 by a LOCOS (local oxidation of silicon) process.

Furthermore, a body region 130 may be formed from the surface of the substrate 101 to a predetermined depth. For example, the body region 130 is an impurity doped region of a first conductivity type, and may be formed while being spaced at a predetermined distance from a drift region 160 to be described below or the body region 130 and the drift region 160 may be formed to contact to each other, and there is no limitation thereto.

When continued, a source region 140 may be formed at the part of the surface of the substrate 101 in the body region 130. The source region 140 may be an impurity doped region of a second conductivity type, and may be electrically connected to a source electrode (not shown). Furthermore, a body contact region 150 may be formed at the part adjacent to the source region 140 or the part in contact with the source region 140. The body contact region 150 may be formed in contact with the source region 140 at the part of the surface of the substrate 101 in the body region 130. The body contact region 150 may be an impurity high concentration doped region of the first conductivity type. The body region 130 may be formed to surround both of the source region 140 and the body contact region 150.

Furthermore, the drift region 160 may be formed from the surface of the substrate 101 to a predetermined depth. At this point, when a doped impurity concentration in the drift region 160 is less than or equal to a predetermined level, the characteristic of the characteristics of specific on-resistance (Rsp) is deteriorated. On the other hand, when a doped impurity concentration is increased equal to or higher than the predetermined level, the characteristics of specific on-resistance (Rsp) is improved but characteristics of breakdown voltage may be deteriorated, and therefore it is preferable to form an impurity region having a doped impurity concentration with an appropriate level in consideration the corresponding characteristics. Furthermore, the drift region 160 is an impurity doped region of the second conductivity type, and preferably is an impurity low concentration doped region in comparison to a drain region 180 to be described below.

Hereinbelow, a structure of a drift region 910 of the conventional high-voltage semiconductor device 9 and problems caused therefrom, and a structure of the drift region 160 according to the embodiment of the present disclosure for solving the problems will be described in detail.

Figure 1:
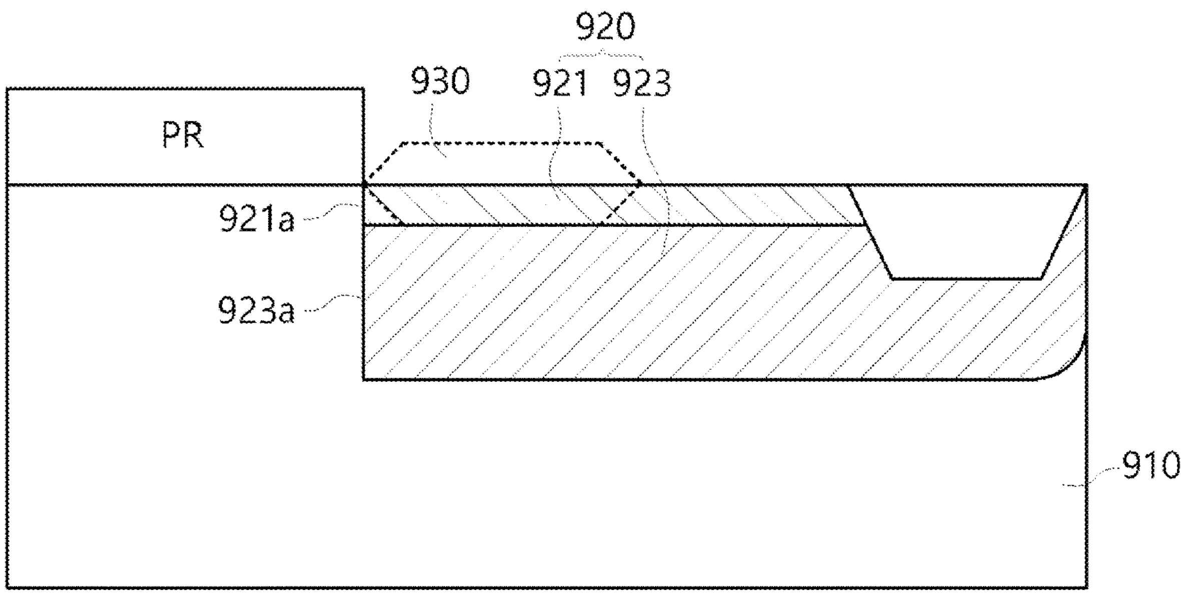
FIG. 1 PRIOR ART
FIG. 1 is a sectional view showing a formation process of a drift region in a conventional high-voltage semiconductor device.

Referring to FIG. 1, the conventional high-voltage semiconductor device 9 may include a drift region 920 formed in a substrate 910, and a gate field plate 930 formed at the part of a surface of the substrate 910 where the drift region 920 is overlapped.

Furthermore, the drift region 920 may be formed by an impurity ion implantation process. In other words, the drift region 920 may be formed by, after forming a photoresist pattern PR on the substrate 910, performing the second conductivity type impurity ion implantation process into the substrate 910. At this point, group 15 elements may be used as the second conductivity type impurity ion. To form the drift region 920, after a first layer 921 is formed at the part of the surface of the substrate 910 by the impurity ion implantation process by using the photoresist pattern PR, a second layer 923 may be formed below the first layer 921 by the impurity ion implantation process. At this point, since the first layer 921 and the second layer 923 are formed by using the same photoresist pattern PR, end portions 921*a* and 923*a* directly below a side wall of the photoresist pattern PR may be formed to be physically distinguishable from each other. In other words, the second layer 923 is not formed in a structure covering the first layer 921, but respective layers 921 and 923 may be formed to be substantially distinguishable from each other.

In this structure of the drift region 920, a problem of concentrating electric fields at the part of an edge of the gate field plate 930 arises. Therefore, the part of the edge of the gate field plate 930 has a structure weak at hot carrier injection effect (HCI), thereby causing a problem of deteriorating the characteristics of breakdown voltage and on-resistance of the device 9.

In order to solve the problem, the high-voltage semiconductor device 1 according to the embodiment of the present disclosure is characterized in that the drift region 160 includes a first impurity region 161 and a second impurity region 163 covering the first impurity region 161. The first impurity region 161 and the second impurity region 163 may be formed by implanting different group 15 element impurity ions. As an example, the first impurity region 161 may be a region formed by implanting arsenic (As) or antimony (Sb) impurity ion, and the second impurity region 163 may be a region formed by implanting phosphorus (P) or arsenic (As) impurity ion but the scope of the present disclosure is not limited thereto.

As described above, the first impurity region 161 and the second impurity region 163 are formed by implanting different group 15 element impurity ions, and it is preferable that a group 15 element used in formation of the second impurity region 163 has smaller atomic mass than a group 15 element used in formation of the first impurity region 161. As an example, the first impurity region 161 may be a region formed by implanting arsenic (As) impurity ions, and the second impurity region 163 may be a region formed by implanting phosphorus (P) impurity ions.

At this point, it is preferable that the second impurity region 163 is formed to cover at least one side wall of the first impurity region 161. For example, the second impurity region 163 may be formed to cover a side wall 161*a* of the first impurity region 161 facing the adjacent source region 140. In describing in detail, it is preferable that the second impurity region 163 covers a lower portion of the first impurity region 161 and one side wall 161*a*. At this point, it is preferable that the second impurity region 163 is formed to also cover the drain extension region 170.

Furthermore, although it will be described in detail below, the first impurity region 161 and the second impurity region 163 may be formed by the ion implantation process using a hard mask M for formation of the gate field plate 120 and the photoresist pattern PR on the hard mask M. For example, the hard mask M is a SiN film, and the thickness thereof may be about 400~600 A (angstrom). Furthermore, the photoresist pattern PR may be formed in a pattern of opening a portion with the drift region 160 formed in the substrate 101.

Although it is described in detail below, in the ion implantation process for formation of the first impurity region 161 by using the hard mask M and the photoresist pattern PR, since a region with implantation into the substrate 101 through the hard mask M on the substrate 101 is formed, a protruding region 1611 may be formed. At this point, the protruding region 1611 may be formed at the part of an end of the first impurity region 161 facing the body region 130. Furthermore, the protruding region 1611 may be formed from the surface of the substrate 101 to a depth less than the depth of the first impurity region 161.

When the drift region 160 has the above-described structure, due to the protruding region 1611 having reduced vertical thickness, the first impurity region 161 may have a doped concentration slightly reduced in comparison with the existing first layer 921, but the doped concentration of the entire drift region 160 may be corrected by formation of the protruding region 1611 covered with the second impurity region 163. Therefore, there is no risk that the characteristics of specific on-resistance (Rsp) of the device 1 is deteriorated. Furthermore, it is preferable that the entire drift region 160 is formed to cover a lower portion of the gate field plate 120.

In addition, the drain extension region 170 may be formed in the substrate 101. The drain extension region 170 may be covered with the drift region 160 but there is no limitation thereto. Furthermore, the drain extension region 170 is a second conductivity type impurity doped region, and preferably is a highly impurity doped region in comparison with the drift region 160. The drain extension region 170 may improve the characteristics of breakdown voltage of the high-voltage semiconductor device 1.

The drain region 180 may be formed in the drain extension region 170 and at the part of a surface of the substrate 101. The drain region 180 is a second conductivity type impurity doped region, and may be a high concentration impurity doped region in comparison with the drain extension region 170. Furthermore, the drain region 180 may be electrically connected to a drain electrode (not shown).

Lastly, the gate region 190 may be formed on the substrate 101. In describing in detail, the gate region 190 may be formed in an active region, between the source region 140 and the drain region 180, and at a portion overlapped with the gate field plate 120. The gate region 190 may include a gate electrode 191, a gate insulator 193, and a gate spacer 195.

The gate electrode 191 is located on a channel region, and a gate voltage applied to the gate electrode 191 may turn on or off the channel region. Furthermore, the gate electrode 191 may be made of one of conductive polysilicon, metal, conductive metallic nitride, or combinations thereof, and may be formed by a CVD, PVD, ALD, MOALD, or MOCVD process, etc. Furthermore, the gate insulator 193 may be formed between the gate electrode 191 and the surface of the substrate 101. The gate insulator 193 may be made of one of silicon oxide films, high dielectric films, or combinations thereof. Furthermore, the gate insulator 193 may be formed by an ALD, CVP, or PVD process, etc.

Furthermore, side surfaces of the gate electrode 191 and the gate insulator 193 may be covered with the gate spacer 195, and the gate spacer 195 may be made of one of oxide films, nitride films, or combinations thereof.

FIGS. 3 to 14 are sectional views showing a method of manufacturing the high-voltage semiconductor device according to an embodiment of the present disclosure.

Hereinbelow, the method of manufacturing the high-voltage semiconductor device according to the embodiment of the present disclosure with reference to accompanying drawings. It should be noted that formation steps of respective components may be performed in time order differently from the description, or may be performed substantially at the same time. Furthermore, manufacturing methods of respective components to be described below are only illustrative, and the scope of the present disclosure is not limited thereto. Furthermore, in the views for describing the method of manufacturing the same, it is shown that the device division film 110 is formed in advance, but it should be noted that the device division film 110 may be formed at an arbitrary time.

First, the drift region 160 and the gate field plate 120 are formed in the substrate 101.

Figure 3:
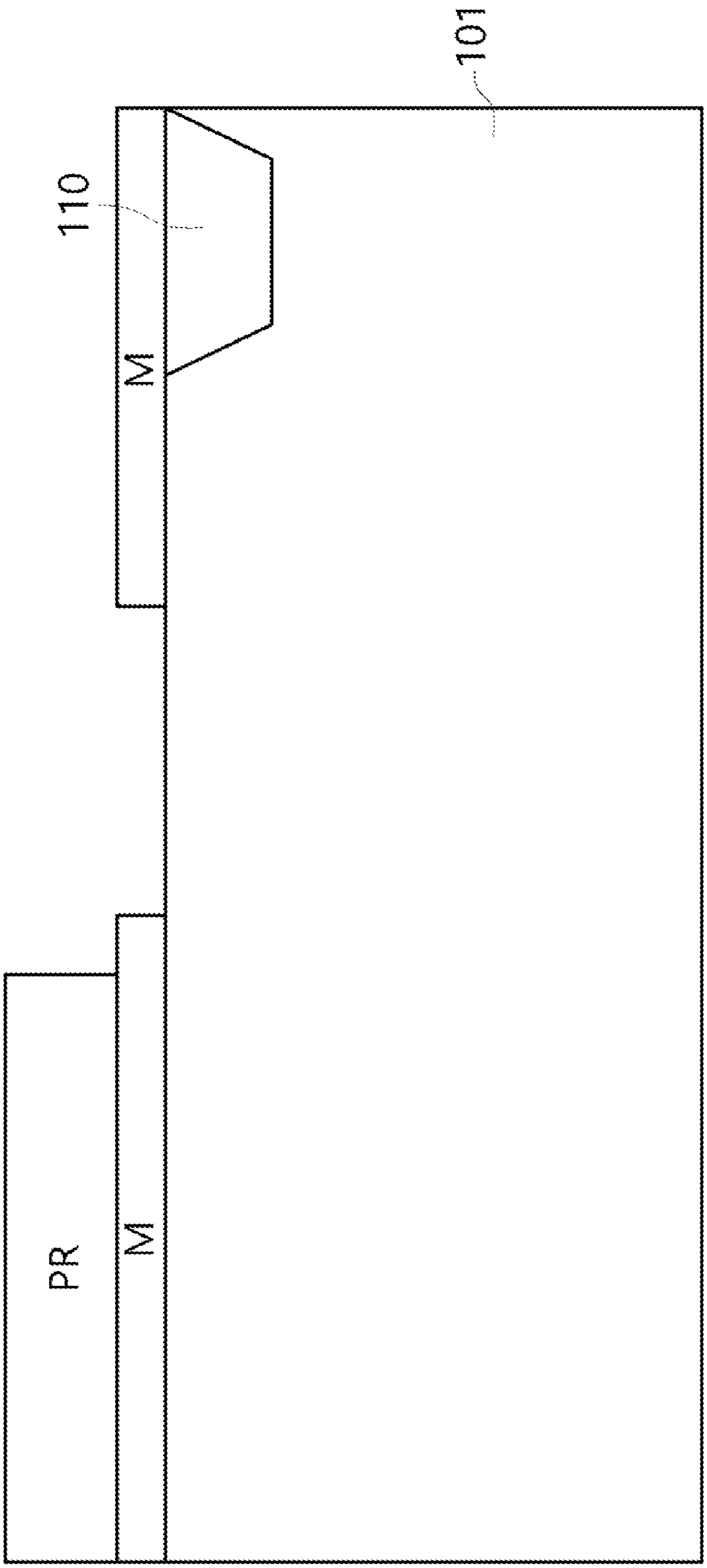
FIGS. 3 to 14 are sectional views showing a method of manufacturing the high-voltage semiconductor device according to an embodiment of the present disclosure.

Referring to FIG. 3, to form the drift region 160, the hard mask M, with the open portion where the gate field plate 120 will be formed, may be formed on the substrate 101. As described above, for example, the hard mask M is a SiN film, and may have a thickness ranging about from 400 to 600 A (angstrom), but the scope of the present disclosure is not limited thereto. Furthermore, the photoresist pattern PR for formation of the drift region 160 may be formed on the hard mask M. Although not shown in FIG. 3, a pad oxide film may be formed between the hard mask M and the surface of the substrate 101.

Figure 4:
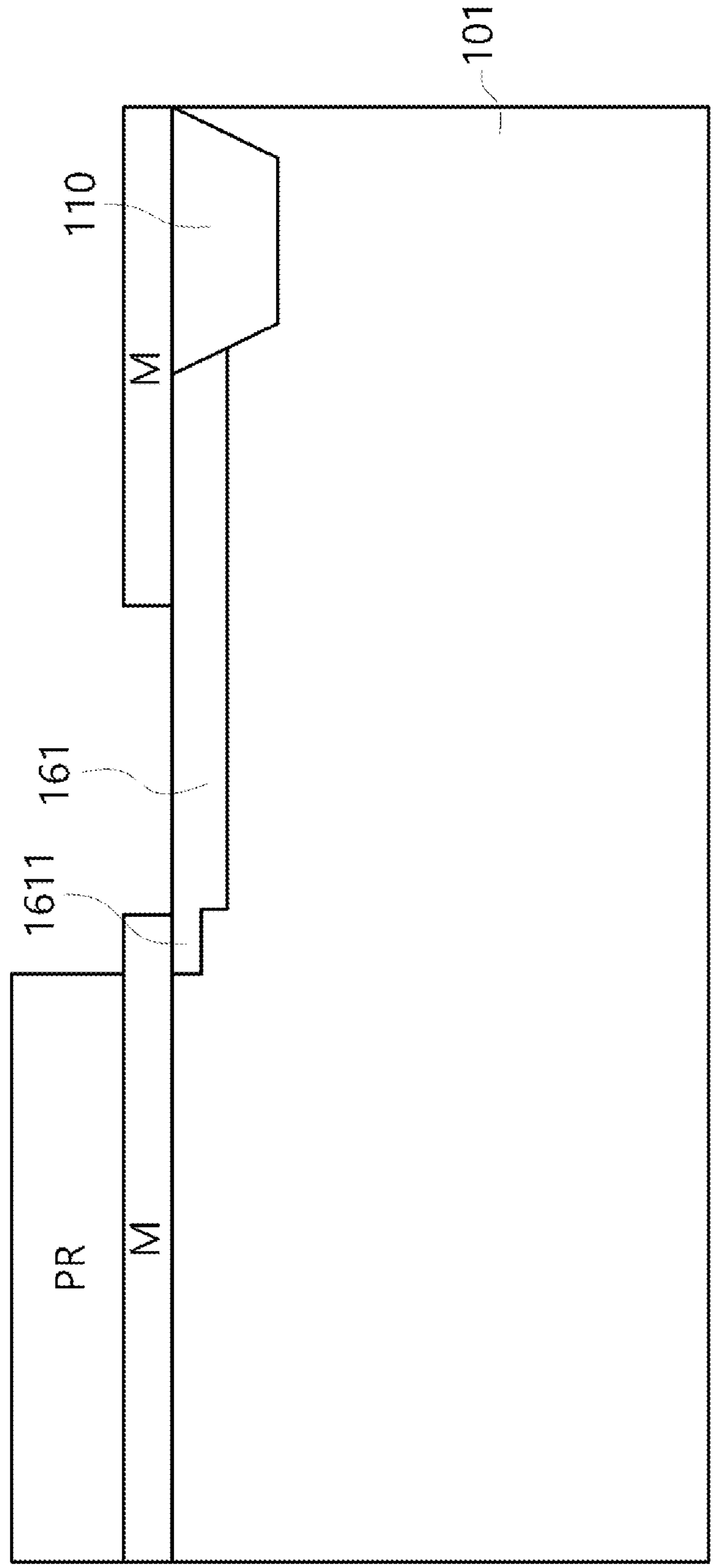

Thereafter, referring to FIG. 4, the hard mask M and the photoresist pattern PR are used to perform the impurity ion implantation process so that the first impurity region 161 is formed at the part of the surface of the substrate 101. As an example, the first impurity region 161 may be formed by the ion implantation process of arsenic (As) impurity ions with energy of 80~150 keV and dose of $10^{10}$~$10^{12}$ ion/$cm^2$. As described above, in the above-described formation of the first impurity region 161, since the region in which the implantation into the substrate 101 through the hard mask M occurs, the protruding region 1611 may be formed.

Figure 5:
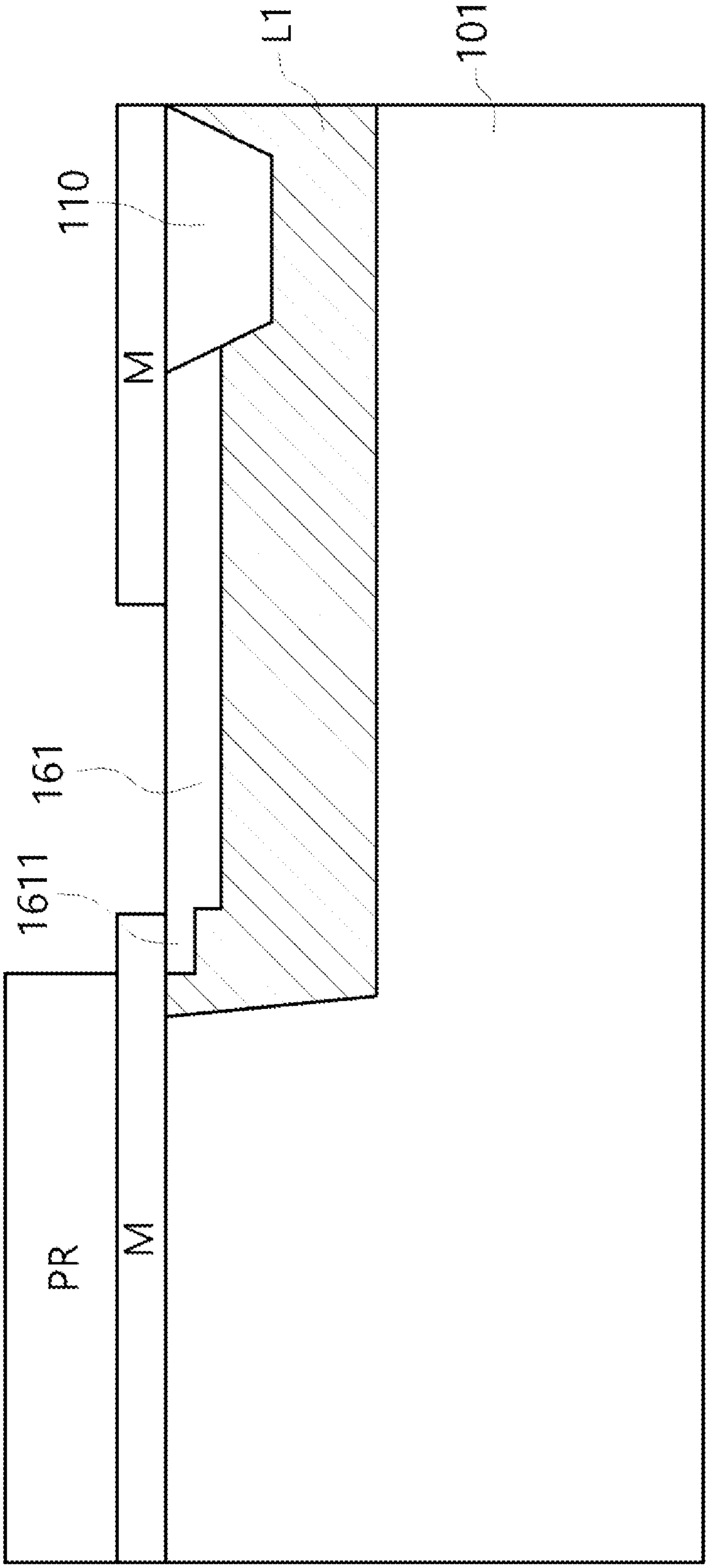

Thereafter, referring to FIG. 5, the hard mask M and the photoresist pattern PR are used to perform the impurity ion implantation process, so that a first layer L1 is formed at a predetermined depth in the substrate 101. For example, the first layer L1 may be formed by performing the ion implantation process of phosphorus (P) impurities with energy of 200~400 keV and dose of $5*10^{11}$~$5*10^{12}$ ion/$cm^2$, but there is no limitation thereto.

Figure 6:
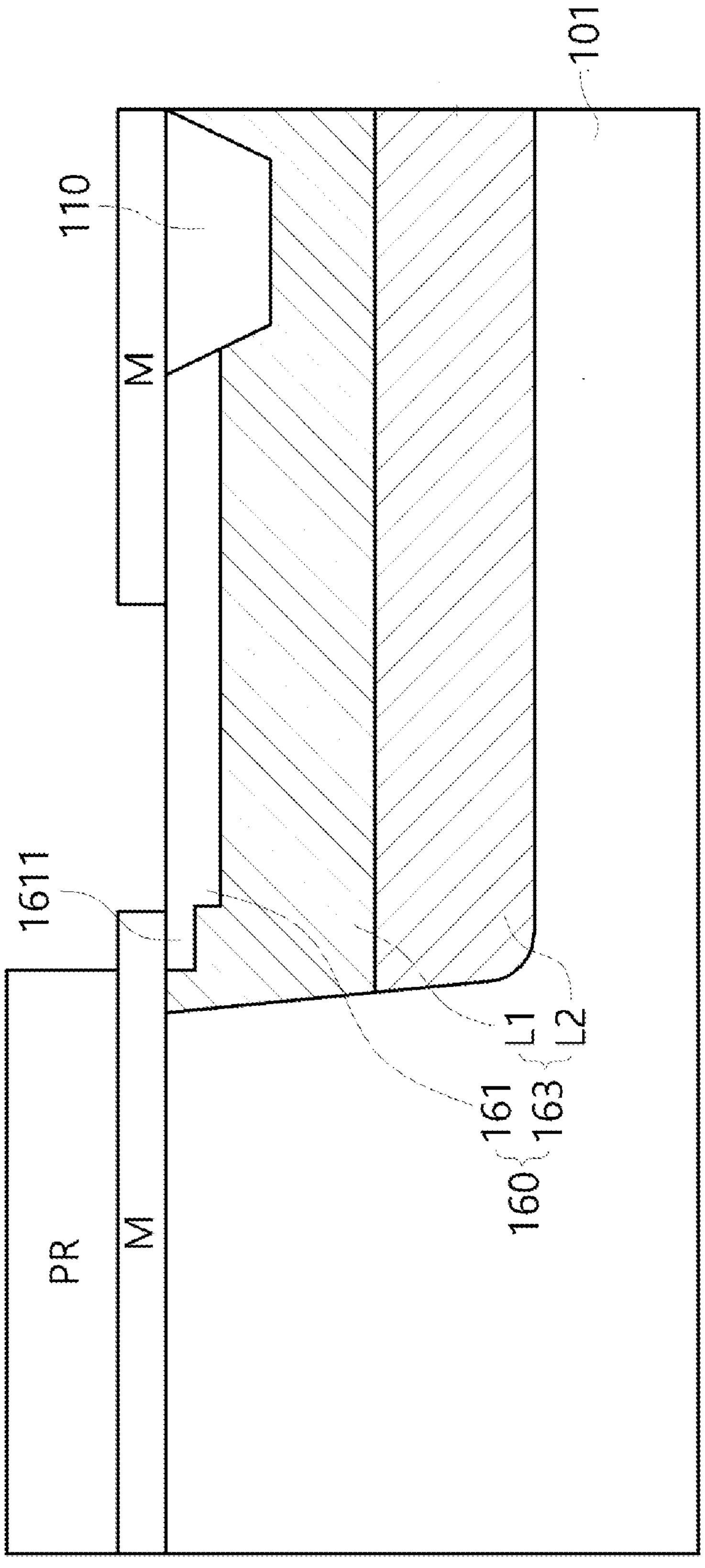

Thereafter, referring to FIG. 6, the hard mask M and the photoresist pattern PR are used to perform the impurity ion implantation process so that a second layer L2 is formed at a predetermined depth in the substrate 101, in other words, below the first layer L1. For example, the second layer L2 may be formed by performing the ion implantation process of phosphorus (P) impurities with energy of 500~1,000 keV and dose of $8*10^{11}$~$5*10^{12}$ ion/$cm^2$, but there is no limitation thereto.

At this point, the portion of the first layer L1, which is overlapped with the hard mask M, and the second layer L2 may be formed with insufficient depth in the substrate 101 due to the hard mask M on the substrate 101. However, considering that the ion implantation energy for forming the first layer L1 and the second layer L2 is higher than the ion implantation energy of the first impurity region 161 and, in the following annealing process, impurities of the first layer L1 and the second layer L2 which have smaller atomic mass than the first impurity region 161 are sufficiently diffused, the second impurity region 163 may be formed as shown in FIGS. 5 and 6.

Figure 7:
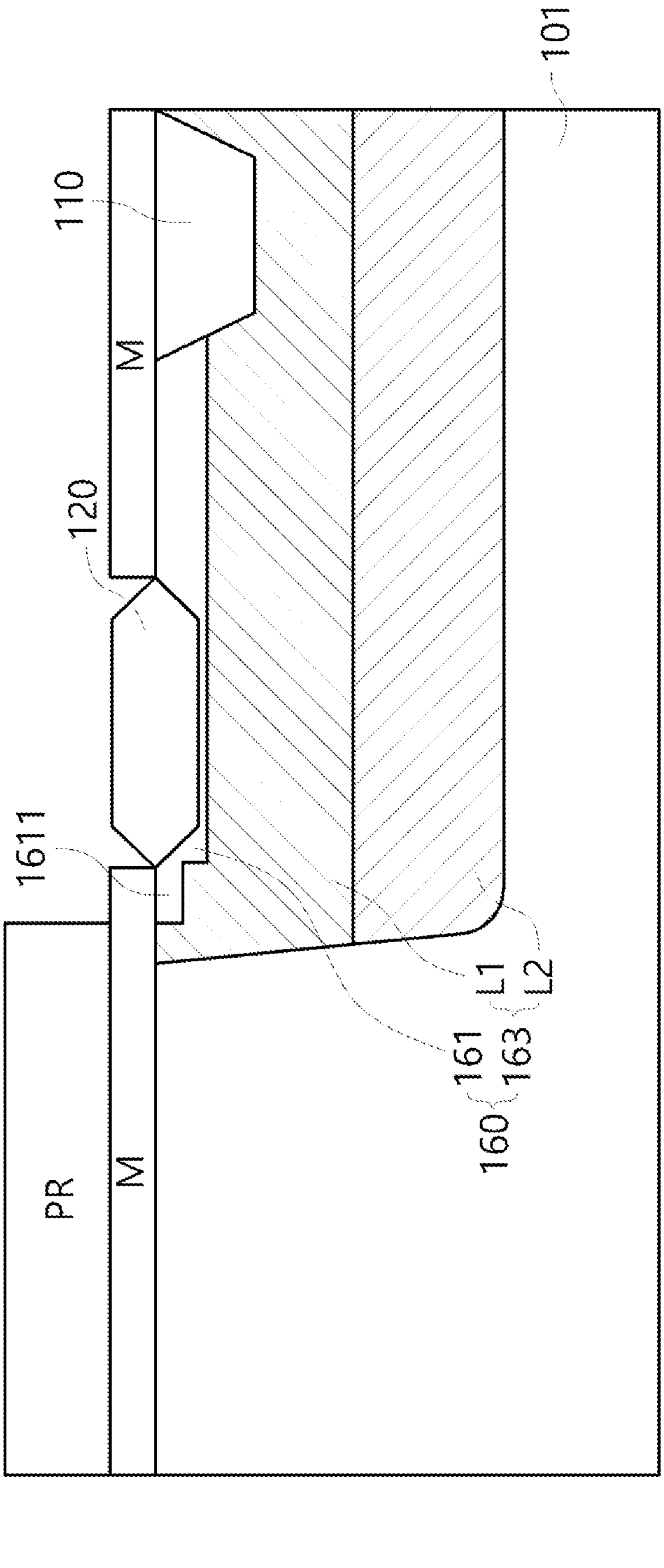

Thereafter, referring to FIG. 7, the hard mask M is used to form the gate field plate 120 at the part of the surface of the substrate 101. The gate field plate 120 may be formed by growing $SiO_2$ through a thermal oxidation process. Thereafter, the annealing process may be performed while removing the hard mask M on the substrate 101 and the photoresist pattern PR.

Figure 8:
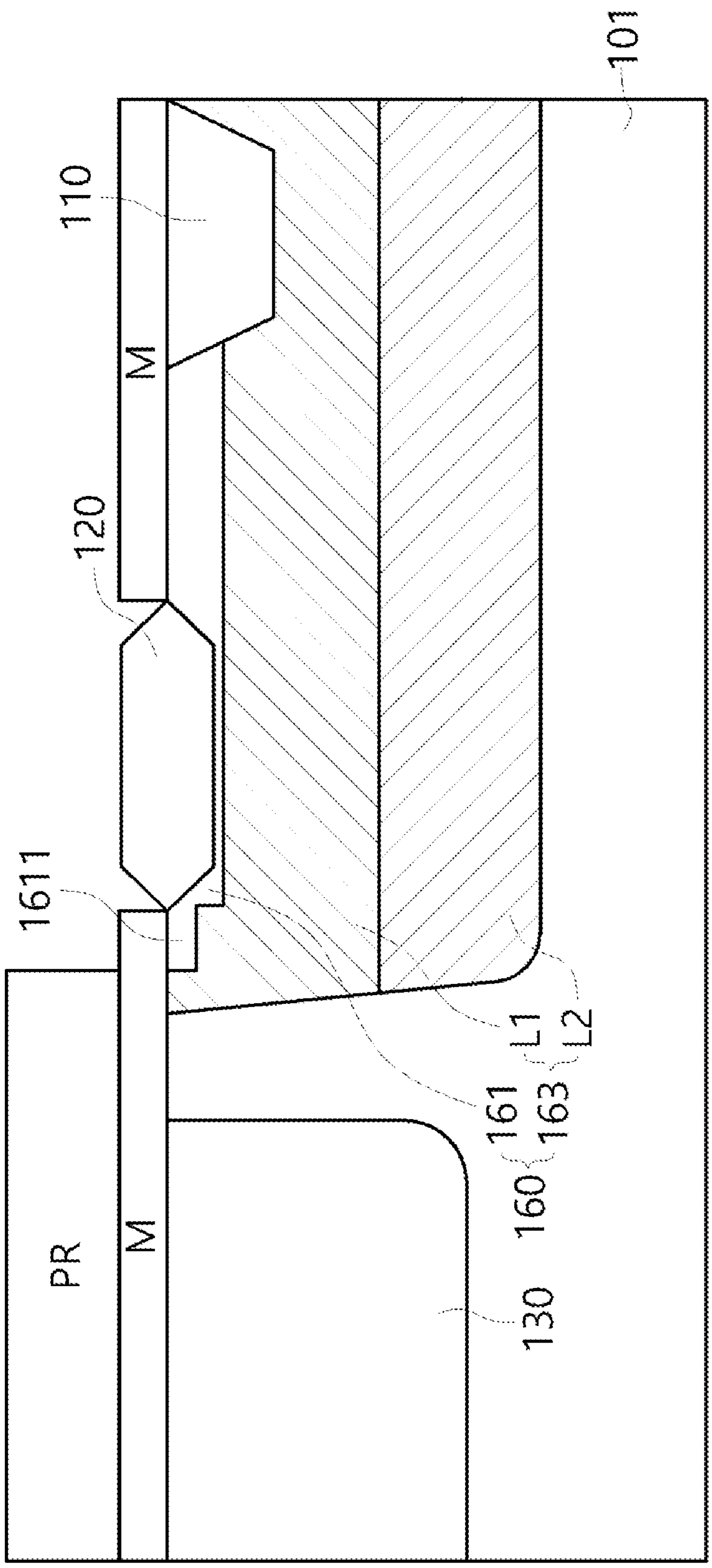

Referring to FIG. 8, after the gate field plate 120 and the drift region 160 are formed, the body region 130 may be formed in the substrate 101. The body region 130 is an impurity doped region of the first conductivity type, and may be formed by ion-implanting impurities of the first conductivity type by using a mask pattern (not shown).

Figure 9:
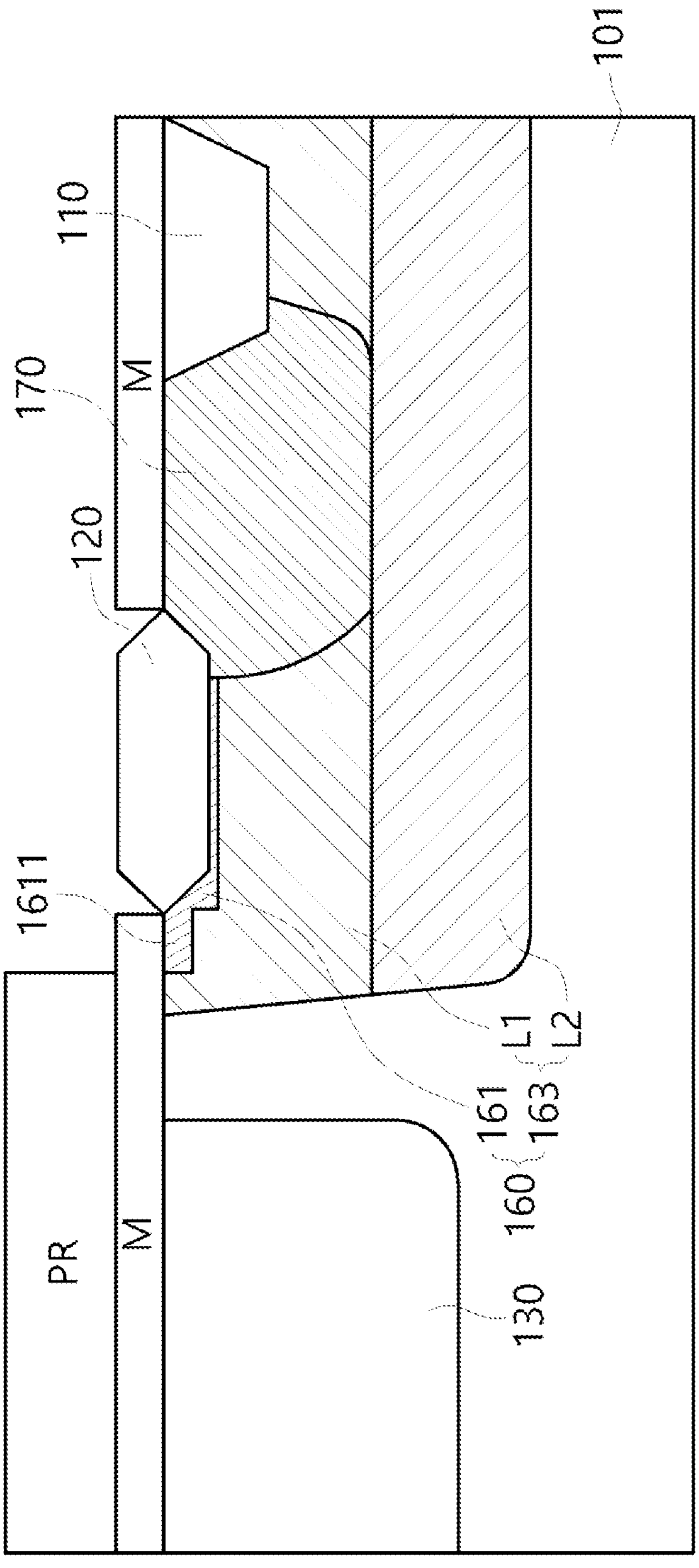

Thereafter, a drain extension region 170 may be formed in the substrate 101 in FIG. 9. The drain extension region 170 is a second conductivity type impurity doped region, and may be a high concentration impurity doped region in comparison with the drift region 160. The drain extension region 170 may be formed by ion-implanting second conductivity type impurities by using the mask pattern (not shown). At this point, the drain extension region 170 may be formed in the drift region 160 to be covered with the drift region 160.

Thereafter, the gate region 190 may be formed on the substrate 101. A formation process of the gate region 190 will be described illustratively.

Figure 10:
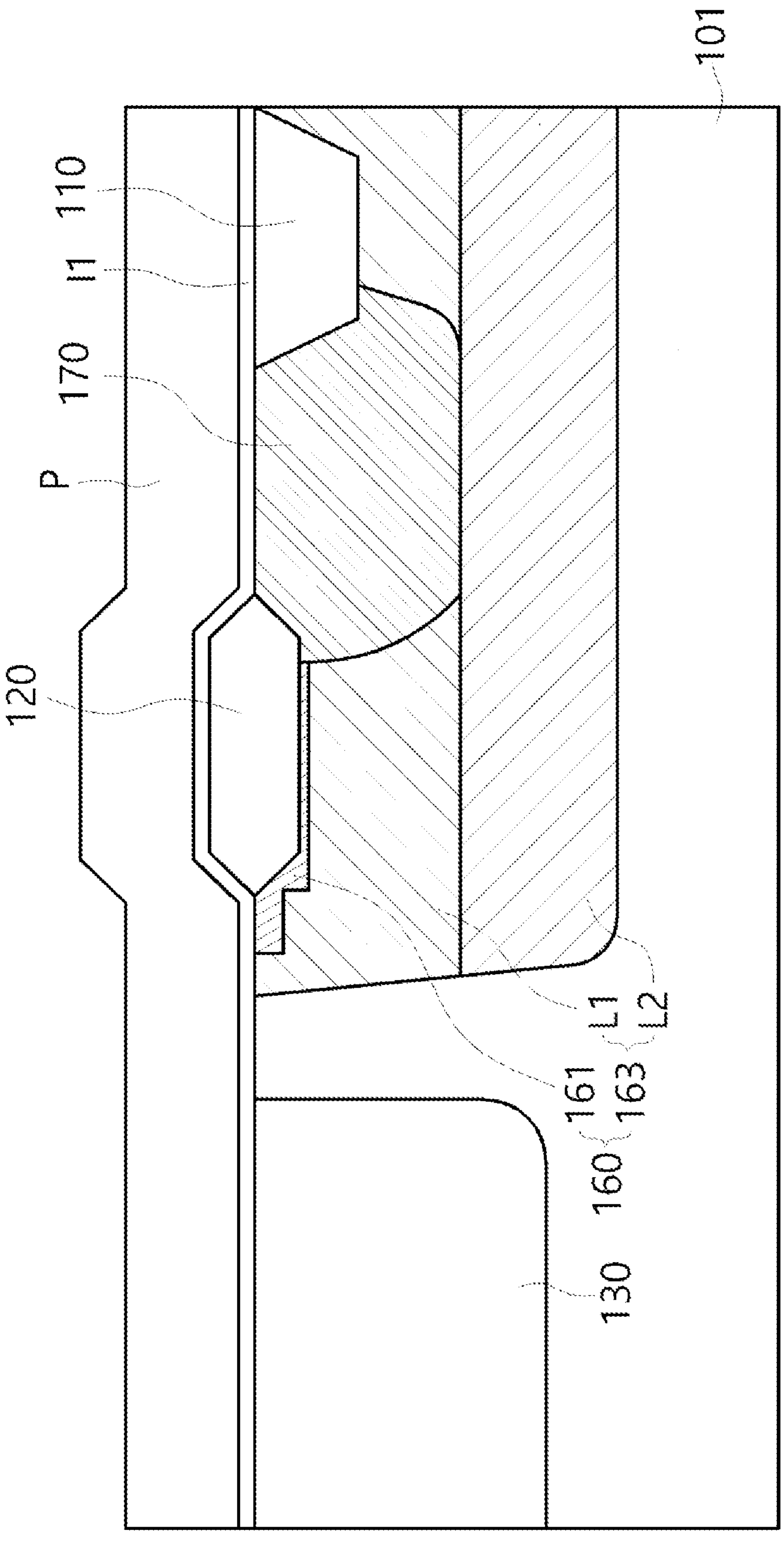
Figure 11:
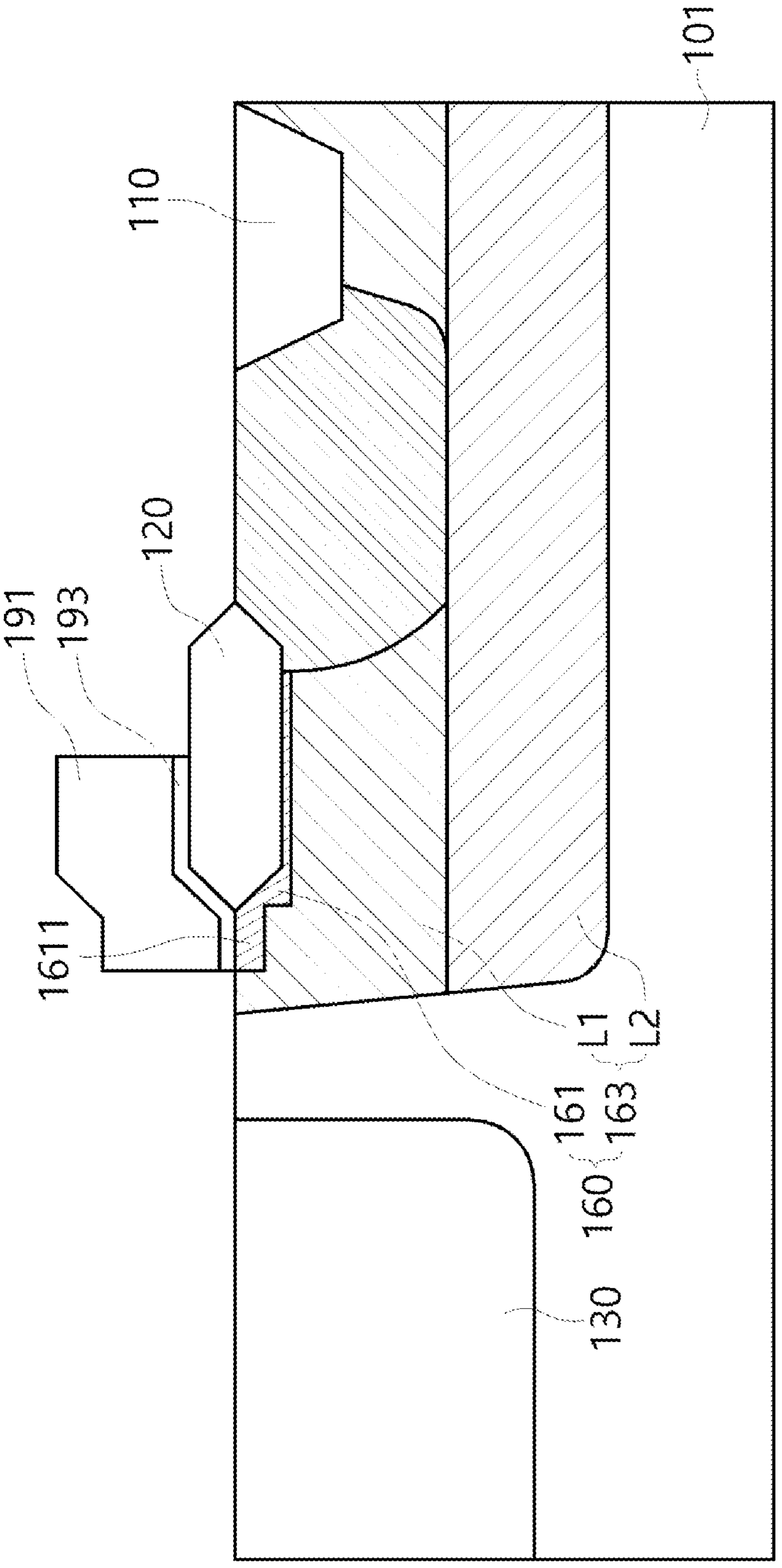
Figure 12:
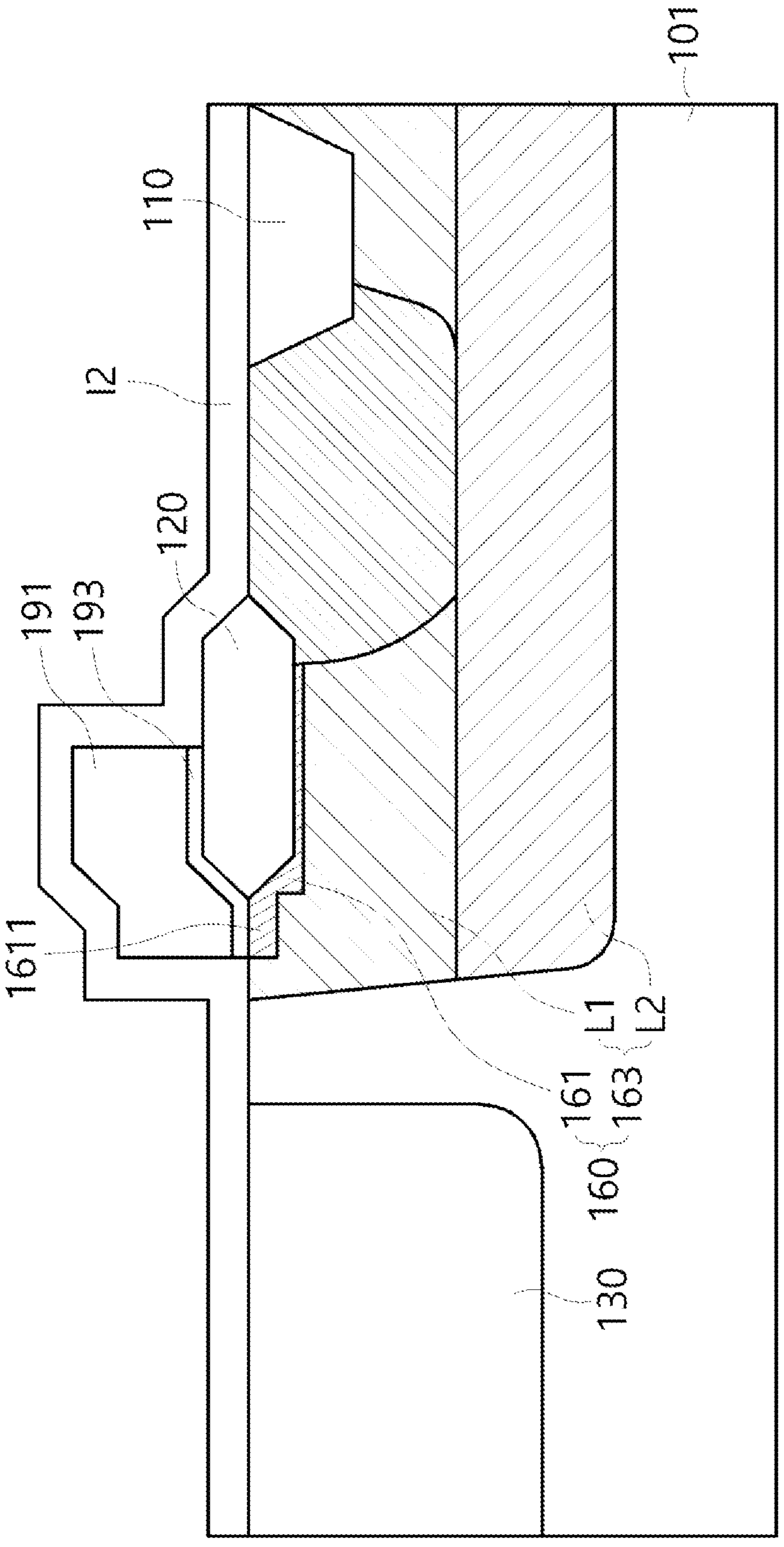
Figure 13:
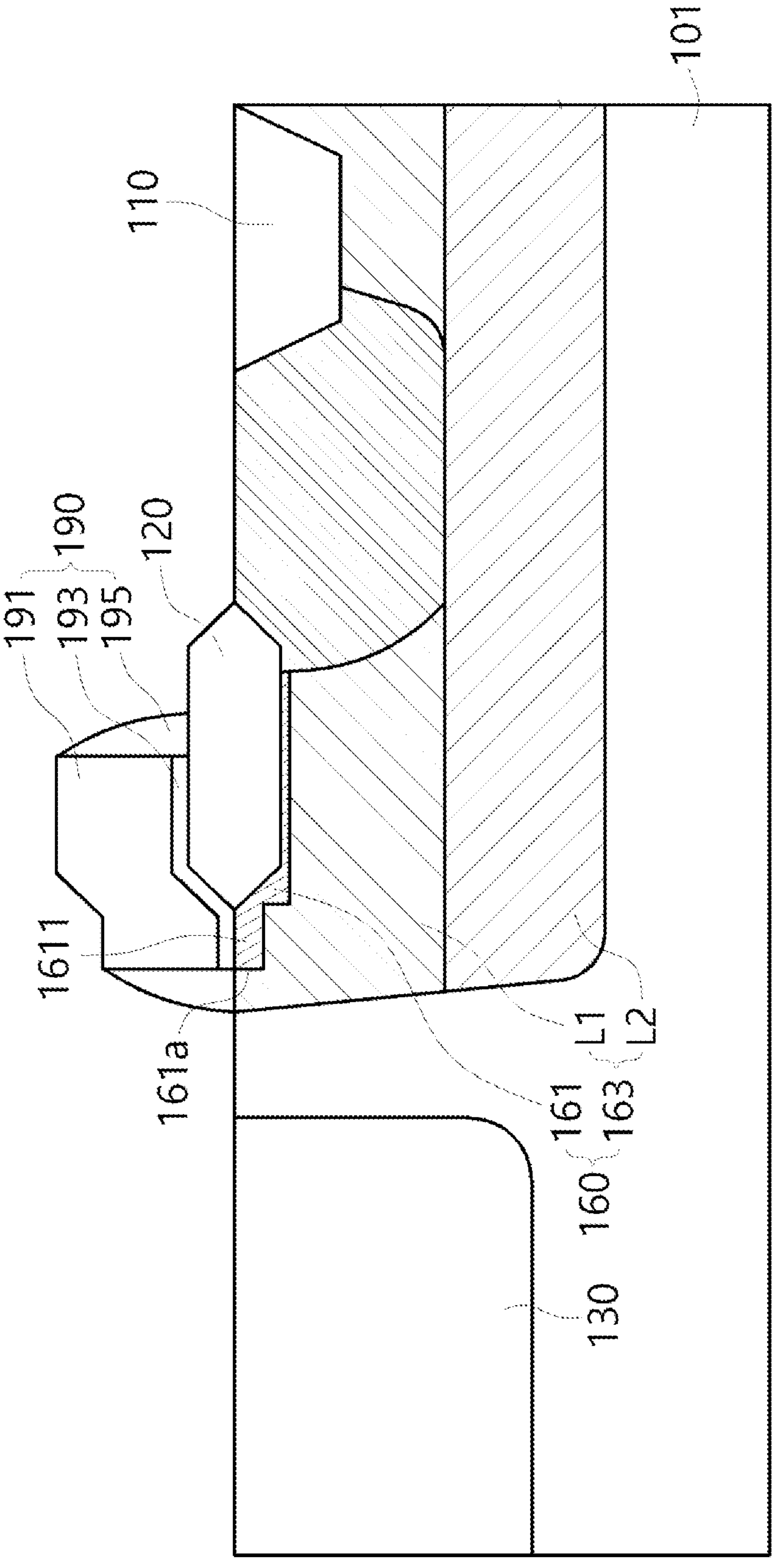

Referring to FIG. 10, first, an insulator layer I1 is formed on the substrate 101 and a gate film P is formed on the first insulator I1, and referring to FIG. 11, the gate electrode 191 and the gate insulator 193 may be formed by successively etching the gate film P and the first insulator I1. Thereafter, referring to FIG. 12, a second insulator I2 is deposited on the substrate 101 to cover the gate electrode 191, and referring to FIG. 13, the gate spacer 195 may be formed by etching the second insulator I2 to cover opposite side walls of the gate electrode 191.

Figure 14:
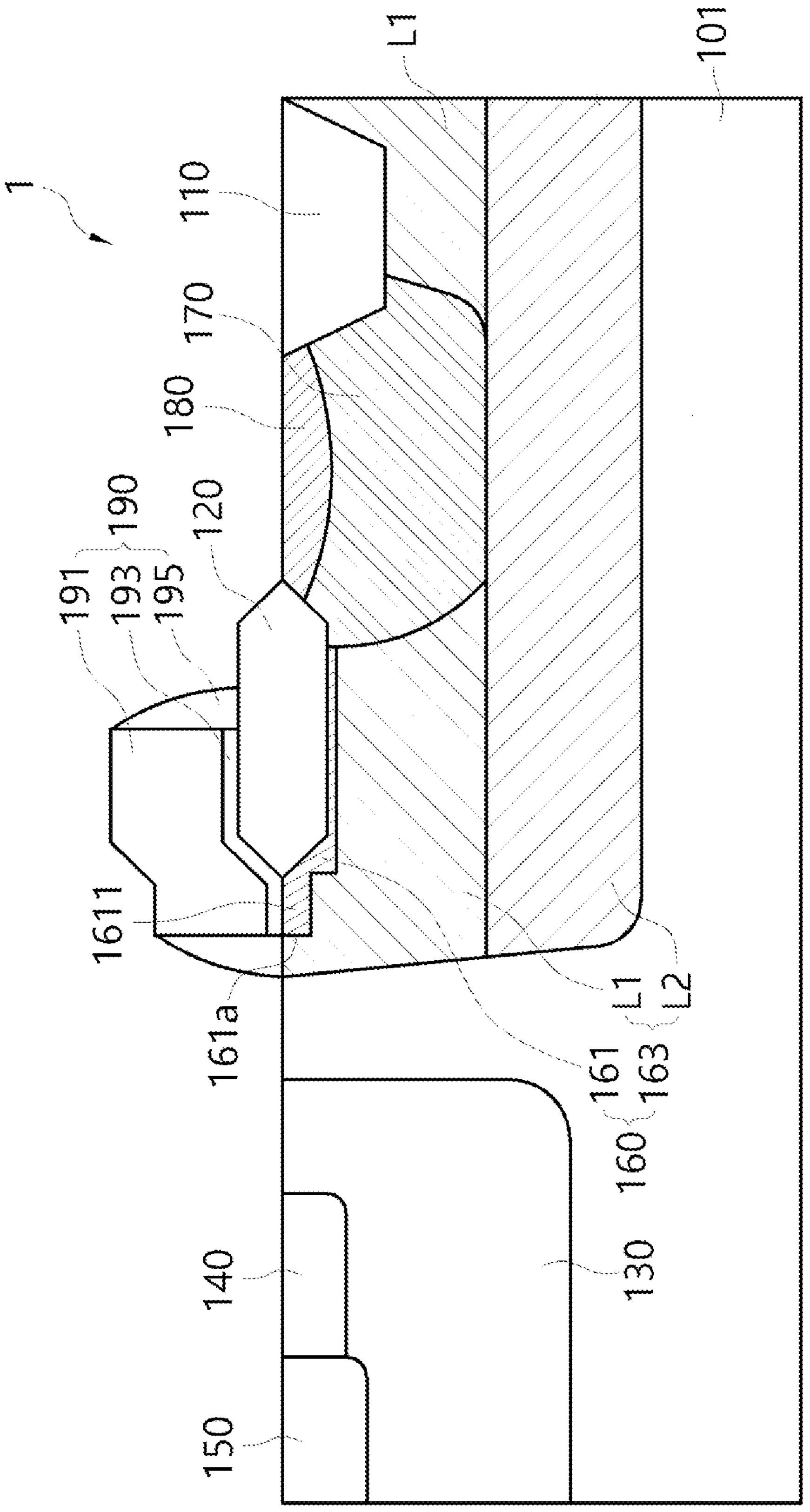

Referring to FIG. 14, after the gate region 190 is formed, the source region 140 and the drain region 180 may be formed. Both of the source region 140 and the drain region 180 are the highly doped regions of second conductivity type impurities, and the source region 140 may be formed in the body region 130 and the drain region 180 is formed in the drain extension region 170.

Thereafter, the body contact region 150 may be formed at the portion in contact with the source region 140, in the body region 130. The body contact region 150 may be the highly doped region of first conductivity type impurities.

The detailed description above is illustrative of the present disclosure. The above detailed description is illustrative of the present disclosure. In addition, the above description shows and describes preferred embodiments of the present disclosure, and the present disclosure can be used in various other combinations, modifications, and environments. In other words, changes or modifications are possible within the scope of the concept of the disclosure disclosed herein, the scope equivalent to the written disclosure, and/or within the scope of skill or knowledge in the art. The above-described embodiments describe the best state for implementing the technical spirit of the present disclosure, and various changes required in the specific application field and use of the present disclosure are possible. Accordingly, the detailed description of the present disclosure is not intended to limit the present disclosure to the disclosed embodiments.

What is claimed is:

1. A high-voltage semiconductor device, comprising:

a substrate;

a gate field plate disposed at a substrate surface of the substrate;

a gate region disposed on the substrate, wherein the gate region is partly disposed on the gate field plate; and a drift region disposed in the substrate, wherein the drift region comprises:

a first impurity region disposed at the substrate surface; and a second impurity region covering at least one side wall of the first impurity region, and wherein the drift region has group 15 element impurity ion, and the second impurity region has group 15 element impurity ion having atomic weight smaller than atomic weight of the group 15 element impurity ion of the first impurity region.

2. The high-voltage semiconductor device of claim 1, wherein the second impurity region covers a lower portion of the first impurity region and the at least one side wall of the first impurity region.

3. The high-voltage semiconductor device of claim 1, wherein the first impurity region is formed by using a hard mask that is used for forming the gate field plate.

4. The high-voltage semiconductor device of claim 1, further comprising:

a body region disposed in the substrate;

a source region disposed at the substrate surface, in the body region; and a drain region disposed apart from the source region, the drain region being disposed at the substrate surface and in the substrate.

5. The high-voltage semiconductor device of claim 4, further comprising:

a drain extension region covering the drain region, the drain extension region being disposed in the substrate, wherein the drain extension region has an impurity low concentration doped region in comparison to the drain region.

6. A high-voltage semiconductor device, comprising:

a substrate;

a gate field plate disposed at a substrate surface of the substrate;

a gate region disposed on the substrate, wherein the gate region is partly disposed on the gate field plate;

a drift region of a second conductivity type disposed in the substrate;

a body region of a first conductivity type disposed in the substrate;

a source region of the second conductivity type disposed in the body region; and a drain region of the second conductivity type disposed in the drift region, wherein the drift region comprises:

a first impurity region disposed at the substrate surface; and a second impurity region disposed below the first impurity region, wherein the first impurity region comprises:

a protruding region protruding towards the source region from a part of the first impurity region facing the source region, and wherein the second impurity region comprises:

a first layer disposed below the first impurity region in the substrate; and a second layer disposed below the first layer in the substrate.

7. The high-voltage semiconductor device of claim 6, wherein the second impurity region covers the protruding region.

8. The high-voltage semiconductor device of claim 6, wherein the drift region has an impurity low concentration doped region in comparison to the drain region.

9. The high-voltage semiconductor device of claim 6, wherein the drift region is formed immediately before a formation process of the gate field plate.

* * * * *